(12) United States Patent
Vesaruch et al.

(10) Patent No.: US 6,479,984 B1
(45) Date of Patent: Nov. 12, 2002

(54) FIXED GUIDE FOR SINGULATOR ARM OF SEMICONDUCTOR HANDLER

(75) Inventors: Supachai Vesaruch, Tanyaburi Pathumthani (TH); Kittinan Chanvivatkun, Nonthaburi (TH); Nopadon Upakaew, Nonthaburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/828,652

(22) Filed: Apr. 5, 2001

(51) Int. Cl.[7] .............................................. G01R 31/02
(52) U.S. Cl. .................................... 324/158.1; 324/765
(58) Field of Search ............................. 324/158.1, 765, 324/754, 755; 193/40; 198/530; 221/251, 274, 293, 298

(56) References Cited

U.S. PATENT DOCUMENTS

| | | | | |
|---|---|---|---|---|
| 2,911,081 A | * | 11/1959 | Dixon | ........................ 193/40 |
| 4,228,901 A | * | 10/1980 | Watzka et al. | ............... 221/251 |
| 4,486,949 A | * | 12/1984 | Allen | ........................... 29/861 |
| 4,506,213 A | * | 3/1985 | O'Connor | .................... 324/755 |

* cited by examiner

Primary Examiner—Ernest Karlsen
(74) Attorney, Agent, or Firm—LaRiviere, Grubman & Payne, LLP

(57) ABSTRACT

A semiconductor device handler has a stop gate and a singulator arm that cooperate to singulate semiconductor devices from an input track onto an input shuttle. Coordination between the gate and arm is provided by a selector arm assembly, which moves the stop gate and singulator arm between a hold configuration, wherein the singulator arm is distanced from the semiconductor devices and the stop gate prevents passage of a device from the input track to the input shuttle, and a release configuration, wherein the singulator arm engages at least one device to hold the device on the input track and the stop gate permits passage of a single device from the input track to the input shuttle. The selector arm assembly includes a fixed guide, at least a portion of which is configured to fit in a gap defined by the selector arm assembly to permanently establish the gap width to be a proper alignment width.

8 Claims, 1 Drawing Sheet

FIXED GUIDE FOR SINGULATOR ARM OF SEMICONDUCTOR HANDLER

TECHNICAL FIELD

The present invention relates generally to testing integrated circuit devices.

BACKGROUND OF THE INVENTION

Semiconductor devices, including integrated circuit devices such as boot-type devices, are tested prior to shipment to ensure quality control. To test a device, the device is engaged with a handler which moves the device into a test position on an electrical tester. The tester is programmed to execute one or more electrical tests on the device to determine whether the device should be shipped or rejected. After testing, the handler moves the device away from the tester to, e.g., a "good device" bin or a "reject" bin.

It will accordingly be appreciated that a handler typically has several assemblies for moving semiconductor devices through the test process. The present invention focuses on a type of handler such as the MCT4610H/C handler, and more particularly on the portion of the handler that moves devices from input tracks onto an input shuttle that sends the devices, one by one, to a test location. Since the devices are tested one at a time, one function of the handler is to "singulate" the devices onto the input shuttle.

In the above-mentioned exemplary MCT4610H/C handler, singulation is accomplished by the cooperation between a singulator arm, which selectively holds and releases devices on an input track, a stop gate, which selectively lifts to allow a device to pass from the input track to the input shuttle, and a selector assembly, which coordinates the movements of the arm and gate. More particularly, the selector assembly moves the arm and gate between a hold configuration, wherein the gate is down and the arm is lifted up to allow a "next" device to be pushed by following devices against the gate, and a release configuration, wherein the arm is lowered onto the device just behind the "next" device at the gate to hold the device, and the gate is lifted to allow the "next" device to proceed to the input shuttle.

It will be appreciated that the above cycle is preferably undertaken quickly and precisely for optimum throughput. To ensure the required precision, it is necessary that the selector assembly be finely adjusted. An out-of-alignment selector assembly can lead to process jams and damaged semiconductor devices.

As recognized by the present invention, selector assemblies must be frequently aligned by adjusting the length of a gap that exists between the end of a selector arm and an abutment that is formed on a selector tip arm, with the selector arm and selector tip arm being connected together. The gap is set by appropriately manipulating the adjusting screw. An improperly aligned gap will result in a lack of precise cooperation between the singulator arm and the stop gate. However, the present invention understands that aligning a selector assembly can be time-consuming, and is typically done by trial and error. Accordingly, the present invention provides the solutions disclosed herein to one or more of the above-noted problems.

BRIEF SUMMARY OF THE INVENTION

A semiconductor device handler with an input track along which semiconductor devices are conveyed to an input shuttle includes a stop gate and a singulator arm. A selector arm assembly is engaged with the stop gate and singulator arm for moving the stop gate and singulator arm between a hold configuration, wherein the singulator arm is distanced from the semiconductor devices and the stop gate prevents passage of a device from the input track to the input shuttle, and a release configuration, wherein the singulator arm engages at least one device to hold the device on the input track and the stop gate permits passage of a single device from the input track to the input shuttle. According to the present invention, the selector arm assembly includes a fixed guide, at least a portion of which is configured to fit in a gap defined by the selector arm assembly.

More particularly, the selector arm assembly includes a selector arm defining an end and a selector tip arm having at least one abutment formed thereon. The gap is established between the end and the abutment, with at least a portion of the fixed guide completely filling the gap to establish an alignment.

In a preferred embodiment, the fixed guide is "E"-shaped and is a unitary piece of metal. As disclosed further below, the preferred selector arm assembly further includes a selector tip screw that holds the fixed guide onto the selector tip arm.

If desired, the selector arm assembly can further include a selector tip on the selector tip arm. The selector tip contacts the stop gate to move the stop gate. Also, the preferred selector arm assembly can have a selector adjustment screw and an arm support. The selector adjustment screw connects the selector arm and the arm support, with the arm support being connected to the singulator arm.

Other features of the present invention are disclosed or apparent in the section entitled "DETAILED DESCRIPTION OF THE INVENTION".

DETAILED DESCRIPTION OF THE INVENTION

Figure 1:
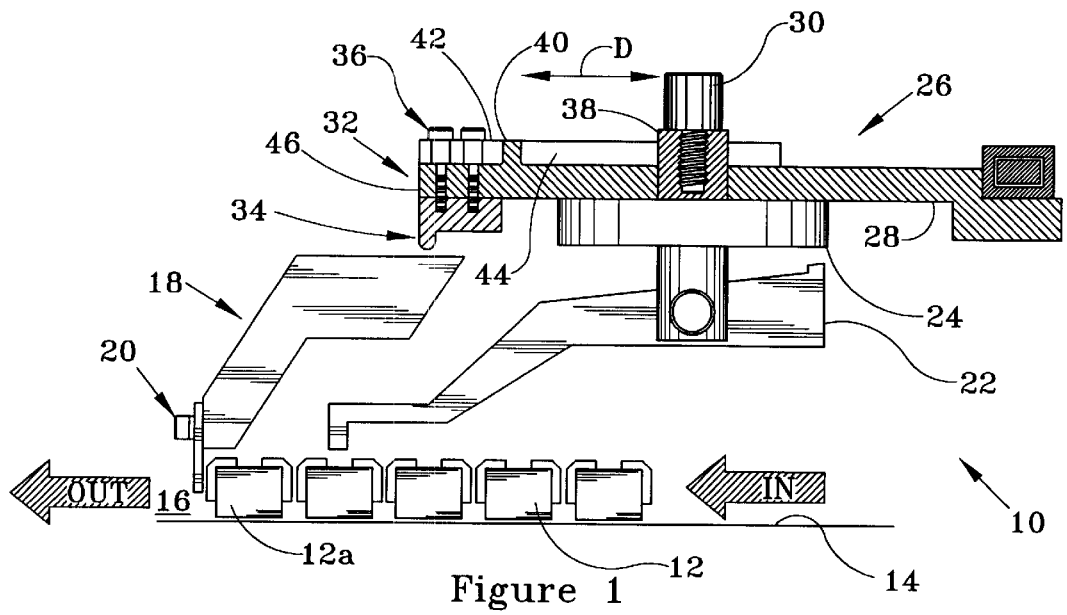
FIG. 1 is a side view of the singulator mechanism in the hold configuration.

Referring initially to FIG. 1, a semiconductor device handler 10 is shown for singulating semiconductor devices 12 from an input track 14 onto an input shuttle 16. As shown, the handler 10 includes a stop gate 18 that pivots between a hold position, shown in FIG. 1, wherein a stopper 20 on the stop gate 18 contacts a "next" semiconductor device 12a, and a release position, shown in FIG. 2, wherein the stopper 20 is distanced from the "next" device 12a to allow the device 12a to move past the stop gate 18 onto the input shuttle 16. The input shuttle 16 can then convey the device 12a to a test location, wherein the device is engaged with, e.g., a Hewlett Packard (HP) tester. In the presently preferred, non-limiting embodiment shown, the handler 10 is a type MCT46xx handler, such as a type MCT4610H/C handler.

Figure 2:
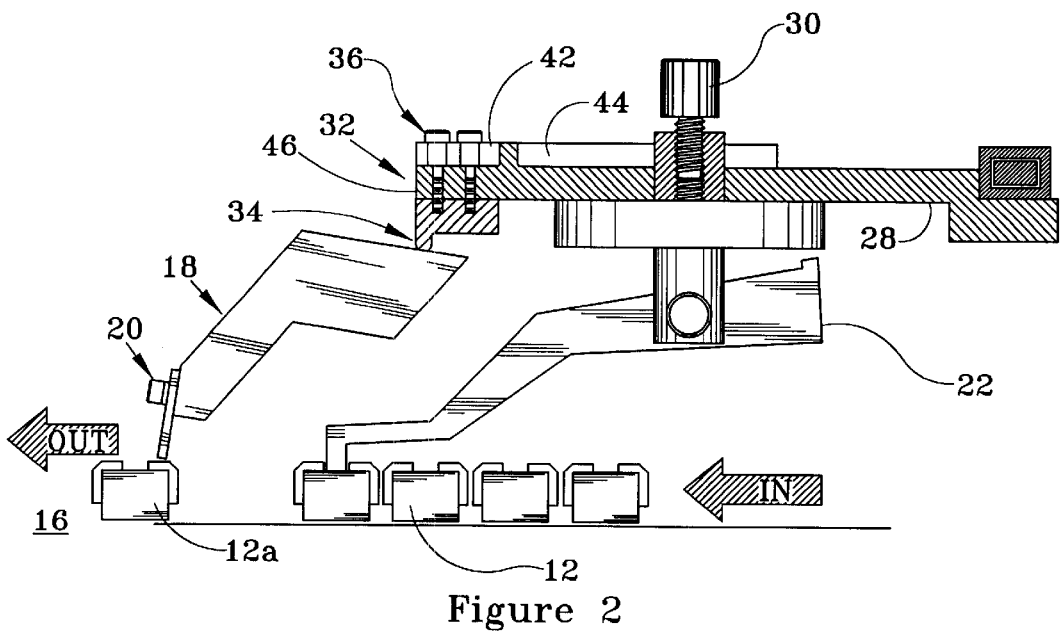
FIG. 2 is a side view of the singulator mechanism in the release configuration.

Furthermore, FIGS. 1 and 2 show that the handler 10 includes a singulator arm 22 that is attached to an arm support 24 of a selector arm assembly, generally designated 26. The selector arm assembly 26 moves the singulator arm 22 between a hold position, shown in FIG. 1, wherein the singulator arm 22 is distanced from the semiconductor devices 12, and a release position, shown in FIG. 2, wherein the singulator arm 22 engages the semiconductor device 12 that is immediately behind the "next" device 12a to hold the device 12 while the stop gate 18 releases the "next" device 12a, thereby achieving singulation as the devices 12 are fed onto the input shuttle.

The coordination between the gate 18 and singulator arm 22 is achieved by the selector arm assembly 26 as follows. A selector arm 28 is engaged with a selector adjustment screw for adjusting the position of the selector arm 28. The screw 30 also holds the arm support 24. As also shown, a selector tip arm 32 is connected to or formed integrally with the selector arm 28 at the screw 30, with the selector arm 28 and selector tip arm 32 being parallel to each other. A selector tip 34 is attached to the bottom of the selector tip arm 32 at the end thereof by two selector tip screws 36. As the selector assembly 26 moves between the hold and release configurations, the selector tip 34 contacts the stop gate 18 as shown to move the stop gate 18, while the singulator arm 22 is raised and lowered. In this way, coordination between the gate 18 and arm 22 is established.

According to the present invention, a gap exists between the end 38 of the selector arm 28 and an abutment 40 that is formed on the selector tip arm 32. Prior to the present invention, it was possible for the gap width to vary, causing misalignment. Accordingly, heretofore the selector adjustment screw 30 was painstakingly adjusted to establish the gap to have a proper width "D", i.e., a width that ensures proper cooperation between the stop gate 18 and the singulator arm 22.

In the present invention, however, a fixed guide 42 has at length one leg 44 of the appropriate width "D" to completely fill the gap, such that the width of the gap never varies from the proper width "D". The guide 42 is held onto the selector tip arm 32 by the selector tip screws 36.

Figure 3:
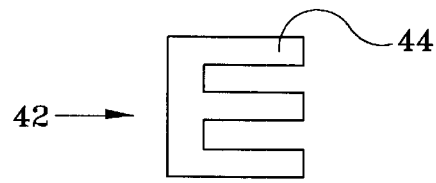
FIG. 3 is a plan view of an exemplary selector guide.

In a preferred embodiment, the guide 42 is made of a single rigid preferably metal piece of material in an "E" configuration, as shown in FIG. 3. In this configuration, the guide 42 extends between the end 38 of the selector arm 28 to the end 46 of the selector tip arm 32 as shown in FIGS. 1 and 2. However, the guide 42 can assume other configurations, as long as at least a discrete leg portion of it has the proper width "D" to establish the correct distance between the end 38 of the selector arm 28 and the abutment 40 of the selector tip arm 32 to ensure proper coordination between the gate 18 and the singulator arm 22.

While the particular FIXED GUIDE FOR SINGULATOR ARM OF SEMICONDUCTOR HANDLER as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A semiconductor device handler, comprising:
   at least one input track along which semiconductor devices are conveyed to at least one input shuttle;
   at least one stop gate;
   at least one singulator arm; and
   at least one selector arm assembly engaged with the stop gate and singulator arm for moving the stop gate and singulator arm between a hold configuration, wherein the singulator arm is distanced from the semiconductor devices and the stop gate prevents passage of a device from the input track to the input shuttle, and a release configuration, wherein the singulator arm engages at least one device to hold the device on the input track and the stop gate permits passage of a single device from the input track to the input shuttle, the selector arm assembly including:
   at least one fixed guide at least a portion of which is configured to fit in a gap defined by the selector arm assembly.

2. The handler of claim 1, wherein the selector arm assembly includes a selector arm defining an end and a selector tip arm having at least one abutment formed thereon, the gap being established between the end and the abutment, at least a portion of the fixed guide completely filling the gap to establish an alignment.

3. The handler of claim 2, wherein the fixed guide is "E"-shaped.

4. The handler of claim 2, wherein the fixed guide is a unitary piece of metal.

5. The handler of claim 2, wherein the selector arm assembly further comprises at least one selector tip screw holding the fixed guide onto the selector tip arm.

6. The handler of claim 2, wherein the selector arm assembly further comprises a selector tip on the selector tip arm, the selector tip contacting the stop gate to move the stop gate.

7. The handler of claim 2, wherein the selector arm assembly further comprises a selector adjustment screw and an arm support, the selector adjustment screw connecting the selector arm and the arm support, the arm support being connected to the singulator arm.

8. A semiconductor device handler, comprising:
   input means for conveying semiconductor devices to shuttle means;
   stop means;
   singulator means; and
   selector means for moving the stop means and singulator means between a hold configuration, wherein passage of a device from the input means to the shuttle means is prevented, and a release configuration, wherein a single device only is permitted to move from the input means to the shuttle means, the selector means including:
   fixed guide means for fitting in a gap defined by the selector means.

* * * * *